United States Patent
Lee

(10) Patent No.: US 9,503,041 B1
(45) Date of Patent: Nov. 22, 2016

(54) AUTOMATIC GAIN CONTROL MODULE, METHOD FOR CONTROLLING THE SAME, VEHICLE INCLUDING THE AUTOMATIC GAIN CONTROL MODULE, AND METHOD FOR CONTROLLING THE VEHICLE

(71) Applicant: HYUNDAI MOTOR COMPANY, Seoul (KR)

(72) Inventor: Yunjae Lee, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 14/942,492

(22) Filed: Nov. 16, 2015

(30) Foreign Application Priority Data

May 11, 2015 (KR) ........................ 10-2015-0065258

(51) Int. Cl.
*G10L 21/034* (2013.01)
*H03G 3/20* (2006.01)
*G10L 21/00* (2013.01)
*G10L 15/22* (2006.01)

(52) U.S. Cl.
CPC .................. *H03G 3/20* (2013.01); *G10L 15/22* (2013.01); *G10L 21/00* (2013.01); *G10L 2015/223* (2013.01)

(58) Field of Classification Search
USPC ......... 704/225, 231–257, 270, 275; 381/320, 381/321, 106, 107, 68.3
See application file for complete search history.

(56) References Cited

U.S. PATENT DOCUMENTS

| | | | |
|---|---|---|---|
| 4,532,648 A * | 7/1985 | Noso | B60R 16/0373 704/275 |
| 5,303,308 A * | 4/1994 | Larsen | H04M 1/6016 333/14 |
| 8,892,450 B2 * | 11/2014 | Schildbach | G10L 19/173 704/210 |
| 2010/0201448 A1 * | 8/2010 | Sasaki | H03G 1/0088 330/278 |
| 2012/0321104 A1 * | 12/2012 | Kemmerer | H03G 3/3021 381/107 |
| 2013/0191124 A1 * | 7/2013 | Honma | G10L 21/034 704/233 |
| 2014/0140538 A1 * | 5/2014 | Kropfitsch | H03G 3/002 381/106 |

FOREIGN PATENT DOCUMENTS

| | | |
|---|---|---|
| JP | 06-082700 U | 11/1994 |
| JP | 08-278796 A | 10/1996 |
| JP | 2002-091487 A | 3/2002 |
| JP | 2004-129187 A | 4/2004 |
| JP | 2010-251937 A | 11/2010 |
| JP | 2012-022127 A | 2/2012 |

OTHER PUBLICATIONS

Korean Office Action dated May 18, 2016, issued in Korean Patent Application No. 10-2015-0065258.

* cited by examiner

*Primary Examiner* — Abul Azad
(74) *Attorney, Agent, or Firm* — McDermott Will & Emery LLP

(57) ABSTRACT

An automatic gain control module includes a first operation unit for determining a first gain value used for amplification of a voice signal in a manner that an energy of the voice signal received from an external part reaches a target energy, a second operation unit for determining a second gain value used for amplification of the voice signal in a manner that a peak value of the voice signal reaches a maximum value capable of being amplified, and a voice amplification unit for amplifying the voice signal according to a minimum value from among the first gain value and the second gain value.

20 Claims, 10 Drawing Sheets

FIG. 4A

| PREVIOUS VOICE SIGNAL INTENSITY [DB] | INTENSITY LEVEL | GAIN VALUE |
|---|---|---|
| 0 ~ -10 | 1 Lv | Error |
| -11 ~ -13 | 2 Lv | -6 |
| -14 ~ -16 | 3 Lv | -3 |
| -17 ~ -28 | 4 Lv | 0 |
| -29 ~ -36 | 5 Lv | +3 |
| -37 ~ -42 | 6 Lv | +6 |
| -48 ~ -∞ | 7 Lv | Error |

FIG. 4B

| INPUT VOICE SIGNAL INTENSITY [DB] | INTENSITY LEVEL | GAIN VALUE |
|---|---|---|
| 0 ~ -10 | 1 Lv | Error |
| -11 ~ -13 | 2 Lv | -6 |
| -14 ~ -16 | 3 Lv | -3 |
| -17 ~ -28 | 4 Lv | 0 |
| -29 ~ -36 | 5 Lv | +17 |
| -37 ~ -42 | 6 Lv | +22 |
| -48 ~ -∞ | 7 Lv | Error |

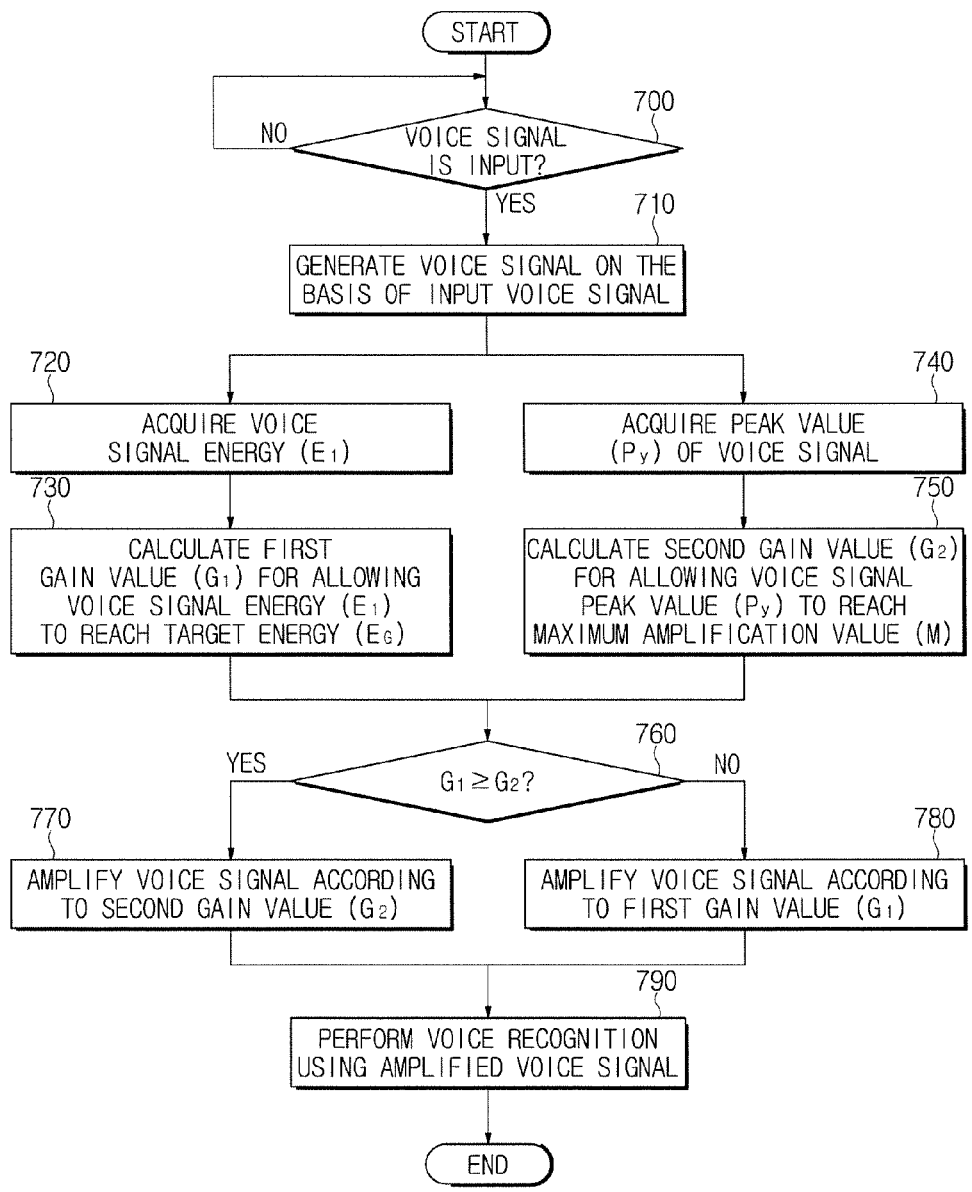

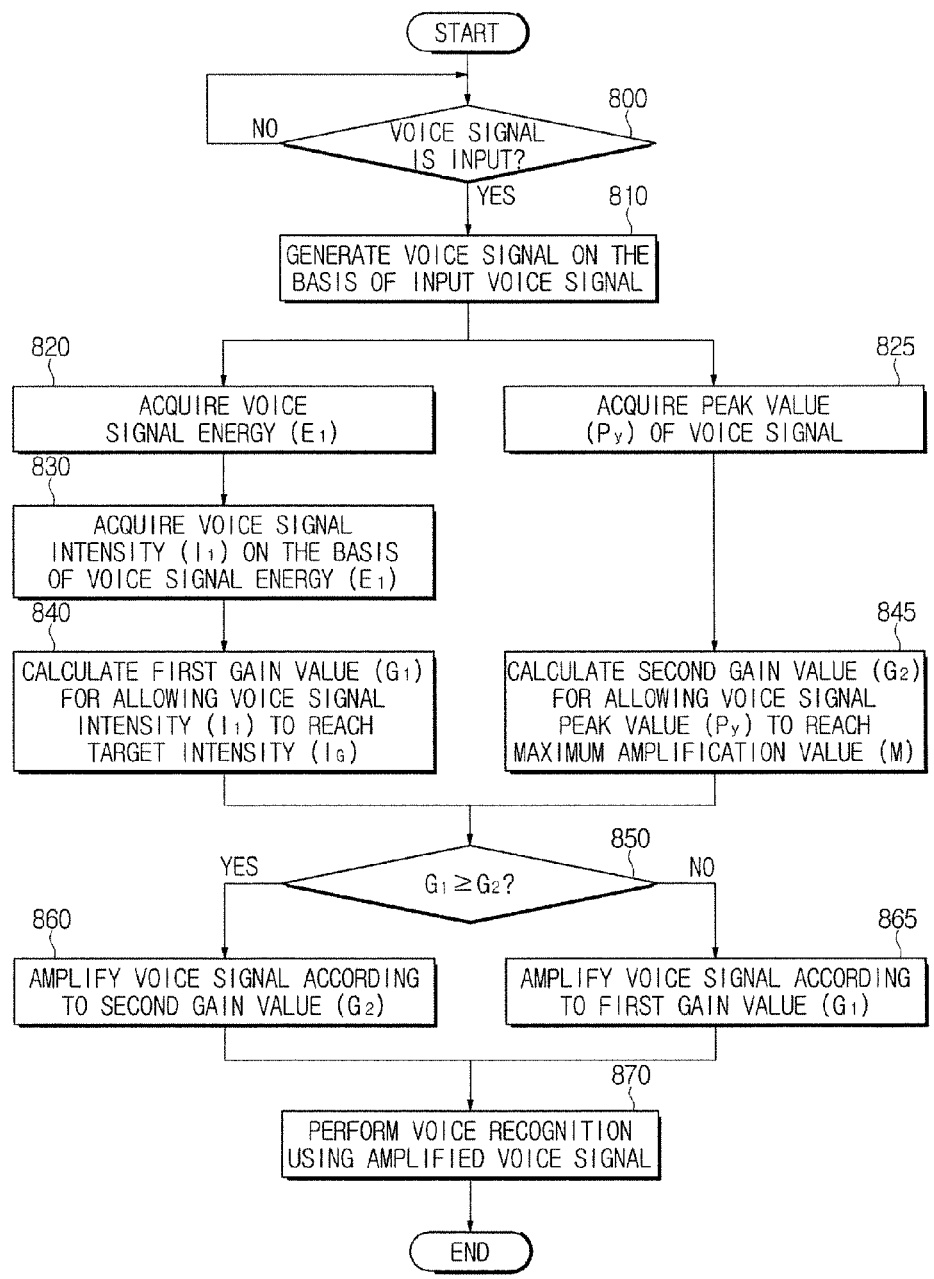

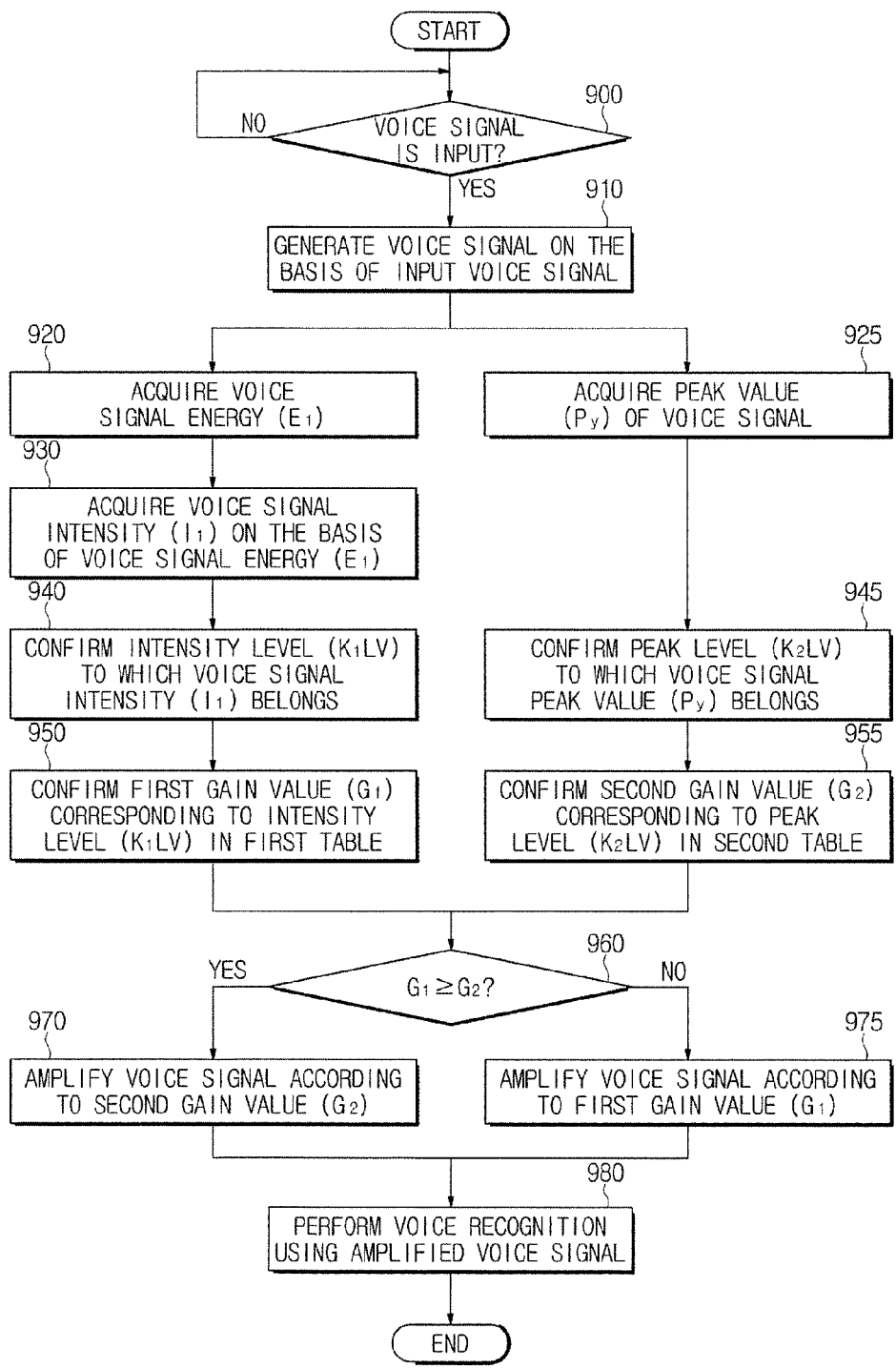

AUTOMATIC GAIN CONTROL MODULE, METHOD FOR CONTROLLING THE SAME, VEHICLE INCLUDING THE AUTOMATIC GAIN CONTROL MODULE, AND METHOD FOR CONTROLLING THE VEHICLE

CROSS-REFERENCE TO RELATED APPLICATION

This application claims priority to Korean Patent Application No. 10-2015-0065258, filed on May 11, 2015 with the Korean Intellectual Property Office, the entirety of which is incorporated herein by reference.

TECHNICAL FIELD

Embodiments of the present disclosure relate to an automatic gain control module for determining a gain value used to amplify a voice signal, a method for controlling the same, a vehicle including the automatic gain control module and a method for controlling the vehicle.

BACKGROUND

With the increasing development of vehicle technology, vehicles may now include convenience features along with basic driving features.

As the number of functions capable of being executed by vehicles rapidly increases, a manipulation load of the vehicle operated by a vehicle driver may increase. The increasing user manipulation load deteriorates a driver's concentration, resulting in a reduction of driving safety. In addition, as the number of functions embedded in the vehicle increases, the manipulation difficulty of a driver may also increase, such that it is impossible for an unskilled driver who has difficulty in vehicle manipulation to efficiently utilize various functions of the vehicle.

Many developers and companies are conducting intensive research into the development of vehicle interface technologies configured to reduce manipulation load and manipulation difficulty. Specifically, various attempts to apply new voice recognition technology, which is capable of recognizing a voice signal of a vehicle driver without additional manipulation so as to perform a specific function corresponding to the recognized voice signal, have been made.

SUMMARY OF THE DISCLOSURE

Therefore, it is an aspect of the present disclosure to provide an automatic gain control module for determining in real time a gain value used to amplify a voice signal so as to achieve optimum signal intensity for voice recognition, a method for controlling the automatic gain control module, a vehicle including the automatic gain control module, and a method for controlling the vehicle.

Additional aspects of the disclosure will be set forth in part in the description which follows and, in part, will be obvious from the description, or may be learned by practice of the disclosure.

In accordance with an aspect of the present disclosure, an automatic gain control module includes: a first operation unit for determining a first gain value used for amplification of a voice signal in a manner that energy of the voice signal received from an external part reaches a target energy; a second operation unit for determining a second gain value used for amplification of the voice signal in a manner that a peak value of the voice signal reaches a maximum value capable of being amplified; and a voice amplification unit for amplifying the voice signal according to a minimum value from among the first gain value and the second gain value.

The first operation unit may acquire an intensity of the voice signal on the basis of the voice signal energy, and determine the first gain value used for amplification of the voice signal in a manner that the voice signal intensity reaches target intensity determined on the basis of the target energy.

The automatic gain control module may further include: a storage unit in which a table including at least one of a gain value corresponding to an intensity level and a gain value corresponding to a peak level is stored.

The first operation unit may confirm an intensity level of the voice signal on the basis of the voice signal energy, confirm a gain value corresponding to the confirmed intensity level from the storage unit, and determine the confirmed gain value to be the first gain value.

The second operation unit may confirm a peak level of the voice signal on the basis of the voice signal peak value, confirm a gain value corresponding to the confirmed peak level from the storage unit, and determine the confirmed gain value to be the second gain value.

The voice amplification unit may not amplify the voice signal when the voice signal energy is equal to or higher than a specific energy at which amplification is unnecessary.

In accordance with another aspect of the present disclosure, a vehicle includes: a voice input unit for generating a voice signal upon receiving a user voice; an automatic gain control module for amplifying the voice signal according to a minimum value from among a first gain value and a second gain value, wherein the first gain value is used to amplify the voice signal in a manner that an energy of the generated voice signal reaches a target energy, and a second gain value is used to amplify the voice signal in a manner that a peak value of the voice signal reaches a maximum value capable of being amplified; and a voice recognition unit for performing voice recognition using the amplified voice signal.

The automatic gain control module may include: a first operation unit for determining a first gain value used for amplification of the voice signal in a manner that the voice signal energy reaches the target energy; a second operation unit for determining a second gain value used for amplification of the voice signal in a manner that the voice signal peak value reaches the maximum value capable of being amplified; and a voice amplification unit for amplifying the voice signal according to a minimum value from among the first gain value and the second gain value.

The first operation unit may acquire an intensity of the voice signal on the basis of the voice signal energy, and determine the first gain value used for amplification of the voice signal in a manner that the voice signal intensity reaches a target intensity determined on the basis of the target energy.

The automatic gain control module may further include: a storage unit in which at least one of a gain value corresponding to intensity level and a gain value corresponding to a peak level is stored.

The first operation unit may confirm an intensity level of the voice signal on the basis of the voice signal energy, confirm a gain value corresponding to the confirmed intensity level from the storage unit, and determine the confirmed gain value to be the first gain value.

The second operation unit may confirm a peak level of the voice signal on the basis of the voice signal peak value, confirm a gain value corresponding to the confirmed peak level from the storage unit, and determine the confirmed gain value to be the second gain value.

The automatic gain control module may not amplify the voice signal when the voice signal energy is equal to or higher than specific energy at which amplification is unnecessary.

In accordance with another aspect of the present disclosure, a method for controlling an automatic gain control module includes: determining a first gain value used for amplification of a voice signal in a manner that an energy of the voice signal received from an external part reaches a target energy; determining a second gain value used for amplification of the voice signal in a manner that a peak value of the voice signal reaches a maximum value capable of being amplified; and amplifying the voice signal according to a minimum value from among the first gain value and the second gain value.

The determining the first gain value may include: acquiring an intensity of the voice signal on the basis of the voice signal energy; and determining the first gain value used for amplification of the voice signal in a manner that the voice signal intensity reaches target intensity determined on the basis of the target energy.

The method may further include: pre-storing a table including at least one of a gain value corresponding to an intensity level and a gain value corresponding to a peak level.

The determining the first gain value may include: confirming an intensity level of the voice signal on the basis of the voice signal energy; confirming a gain value corresponding to the confirmed intensity level from the table; and determining the confirmed gain value to be the first gain value.

The determining the second gain value may include: confirming a peak level of the voice signal on the basis of the voice signal peak value; confirming a gain value corresponding to the confirmed peak level from the table; and determining the confirmed gain value to be the second gain value.

The method may further include: if the voice signal energy is equal to or higher than specific energy at which amplification is unnecessary, not-amplifying the voice signal.

In accordance with another aspect of the present disclosure, a method for controlling a vehicle includes: generating a voice signal upon receiving a user voice; amplifying the voice signal according to a minimum value from among a first gain value and a second gain value, wherein the first gain value is used to amplify the voice signal in a manner that an energy of the generated voice signal reaches a target energy, and a second gain value is used to amplify the voice signal in a manner that a peak value of the voice signal reaches a maximum value capable of being amplified; and performing voice recognition using the amplified voice signal.

The amplifying the voice signal may include: determining a first gain value used for amplification of the voice signal in a manner that the voice signal energy reaches the target energy; determining a second gain value used for amplification of the voice signal in a manner that the voice signal peak value reaches the maximum value capable of being amplified; and amplifying the voice signal according to a minimum value from among the first gain value and the second gain value.

The determining the first gain value may include: acquiring an intensity of the voice signal on the basis of the voice signal energy; and determining the first gain value used for amplification of the voice signal in a manner that the voice signal intensity reaches target intensity determined on the basis of the target energy.

The method may further include: pre-storing a table including at least one of a gain value corresponding to an intensity level and a gain value corresponding to a peak level.

The determining the first gain value may include: confirming an intensity level of the voice signal on the basis of the voice signal energy; confirming a gain value corresponding to the confirmed intensity level from the table; and determining the confirmed gain value to be the first gain value.

The determining the second gain value may include: confirming a peak level of the voice signal on the basis of the voice signal peak value; confirming a gain value corresponding to the confirmed peak level from the table; and determining the confirmed gain value to be the second gain value.

The amplifying the voice signal may further include: not-amplifying the voice signal when the voice signal energy is equal to or higher than specific energy at which amplification is unnecessary.

BRIEF DESCRIPTION OF THE DRAWINGS

These and/or other aspects of the disclosure will become apparent and more readily appreciated from the following description of the embodiments, taken in conjunction with the accompanying drawings of which:

FIG. 4A exemplarily illustrates a conventional table including gain values corresponding to intensities of a voice signal, and FIG. 4B illustrates an exemplary table including gain values corresponding to intensities of a voice signal according to an embodiment of the present disclosure.

FIG. 6 is a flowchart illustrating a vehicle control method according to an embodiment of the present disclosure.

FIG. 7 is a flowchart illustrating a vehicle control method according to another embodiment of the present disclosure.

FIG. 8 is a flowchart illustrating a vehicle control method according to another embodiment of the present disclosure.

DETAILED DESCRIPTION

Figure 1:
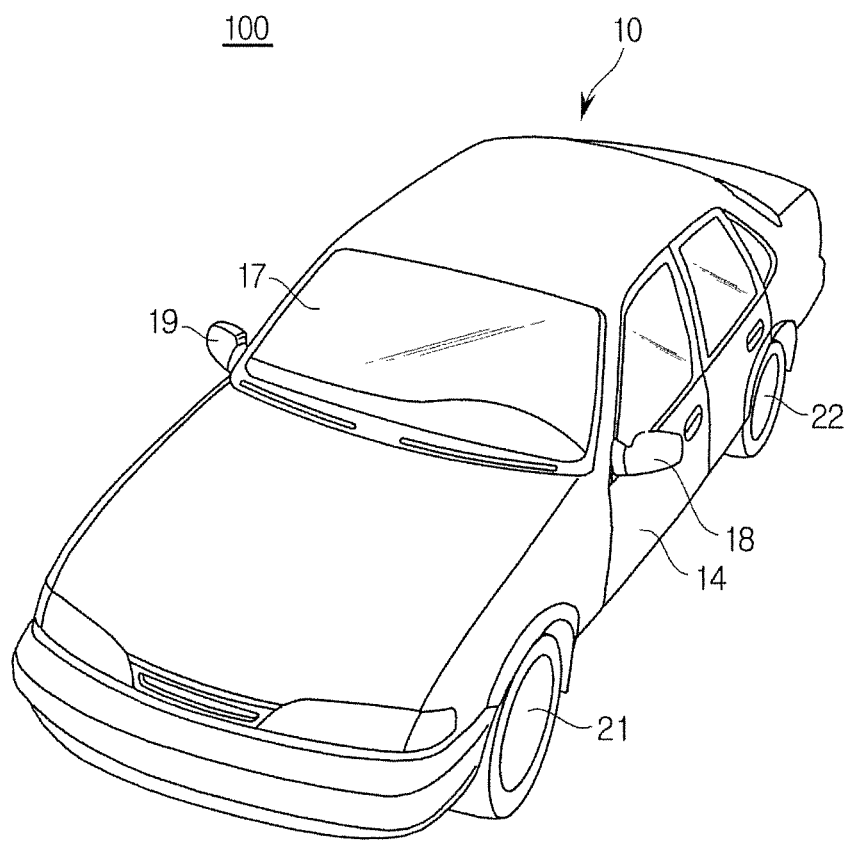
FIG. 1 is a perspective view illustrating the appearance of a vehicle according to an embodiment of the present disclosure.

Reference will now be made in detail to the embodiments of the present disclosure, examples of which are illustrated in the accompanying drawings, wherein like reference numerals refer to like elements throughout. An automatic gain control module, a method for controlling the same, a vehicle including the automatic gain control module, and a method for controlling the vehicle according to embodiments of the present disclosure will hereinafter be described with reference to the attached drawings.

FIG. 1 is a perspective view illustrating the appearance of a vehicle according to an embodiment of the present disclosure.

Referring to FIG. 1, the vehicle 1 according to the embodiment includes a main body 10 forming the exterior of the vehicle 100, vehicle wheels (21, 22) to move the vehicle 100, doors 14 to shield an indoor space of the vehicle 100 from the outside, a vehicle windshield 17 to provide a forward view of the vehicle 100 to a vehicle driver who rides in the vehicle 100 and side-view mirrors (18, 19) to provide a rear view of the vehicle 100 to the vehicle driver.

The wheels (21, 22) may include front wheels 21 provided at the front of the vehicle and rear wheels 22 provided at the rear of the vehicle. The front wheels 21 or the rear wheels 22 may receive a rotational force from a drive unit in a manner that the main body 10 moves forward or backward.

The doors 14 are rotatably provided at the right and left sides of the main body 10 so that a vehicle driver can enter the vehicle 100 when any of the doors 14 is open and an indoor space of the vehicle 100 can be shielded from the outside when the doors 14 are closed.

The windshield 17 is provided at a front upper portion of the main body 10 so that a vehicle driver who rides in the vehicle 100 can obtain visual information in a forward direction of the vehicle 100. The windshield 17 may also be referred to as a windshield glass.

The side-view mirrors (18, 19) may include a left side-view mirror 18 provided at the left of the main body 1 and a right side-view mirror 19 provided at the right of the main body 1, so that the driver who rides in the vehicle 100 can obtain visual information in the lateral and rear directions of the vehicle 100.

Figure 2:
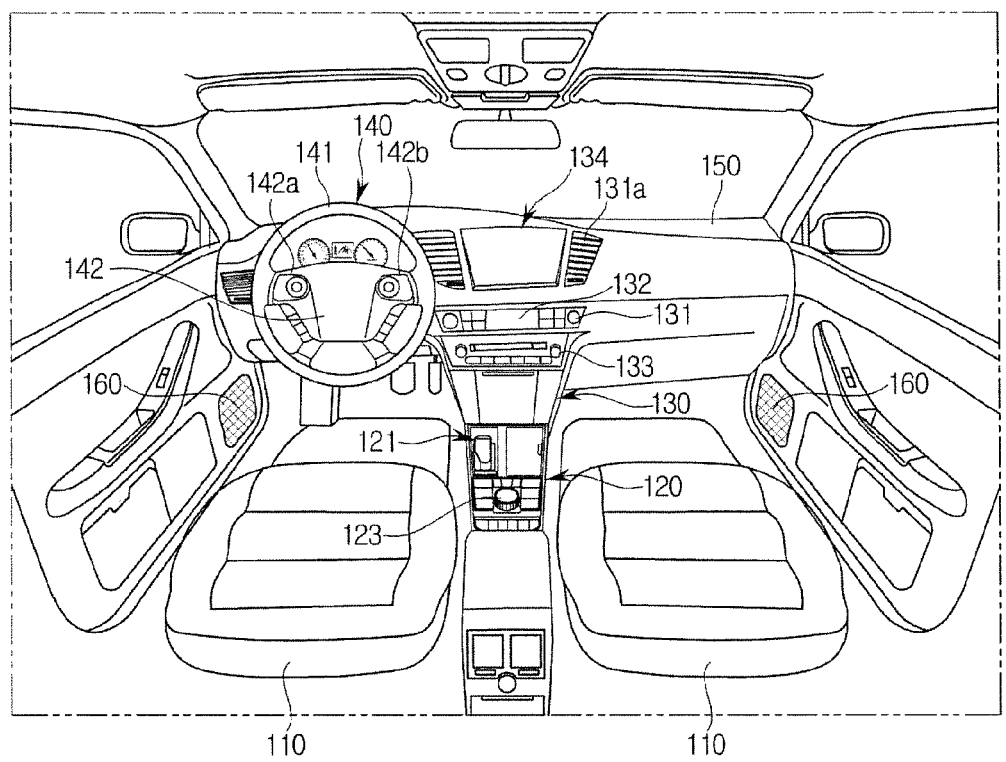
FIG. 2 is a view illustrating the internal structure of the vehicle according to an embodiment of the present disclosure.

FIG. 2 is a view illustrating the internal structure of the vehicle according to an embodiment of the present disclosure.

Referring to FIG. 2, the vehicle 100 may have a seat 110 on which a passenger is seated; a dashboard 150 including a gearbox 120, a center fascia 130, a steering wheel 140 and a speaker 160.

A gearshift 121 for changing gears may be installed near the gearbox 40. In addition, as can be seen from FIG. 2, a dial manipulation unit 42 for allowing a user to control a navigation device 51, or the principal functions of the vehicle, may be installed near the gearbox 40.

A gearshift 121 for changing gears of the vehicle 100 may be installed near the gearbox 120, and a dial manipulation unit 122 for controlling functions of the vehicle 100 may be installed near the gearbox 120.

The steering wheel 140 is a device that adjusts a traveling direction of the vehicle 100, is connected to a rim 141 grasped by a vehicle driver and a steering device of the vehicle 100, and includes a spoke 142 to connect the rim 141 to a hub of a rotation axis for steering. In accordance with one embodiment, the spoke 142 may include various devices embedded in the vehicle 100, for example, manipulation devices (142a, 142b) for controlling the audio device.

The center fascia 130 embedded in the dashboard 150 may include an air-conditioner 131, a clock 132, an audio device 133 and a display.

The air-conditioner 131 can maintain temperature, humidity, purity and airflow of indoor air of the vehicle 100 in a comfortable or pleasant condition. The air-conditioner 131 may be installed at the center fascia 130, and may include at least one air outlet 131a through which air is discharged. A button or dial for controlling the air-conditioner 131 may be installed at the center fascia 130. A user such as a vehicle driver may control the air-conditioner 131 of the vehicle using the button or dial mounted to the center fascia 130.

The clock 132 may be located in the vicinity of the button or dial for controlling the air-conditioner 131.

The audio device 133 may include a manipulation panel including a plurality of buttons needed to perform functions of the audio device 133. The audio device 133 may provide a radio mode for providing a radio function and a media mode for reproducing audio files stored in various storage media.

The display 134 may output information associated with the vehicle 100 in the form of an image or text. For example, upon receiving an output signal for controlling the vehicle 100 to output a recommended traveling method, the display 134 may output the recommended traveling method corresponding to the output signal in the form of an image or text, such that passengers of the vehicle can recognize the recommended traveling method through the display 134.

For this purpose, the display 134 may be embedded in the center fascia 130. However, the scope or spirit of installation examples of the display 134 is not limited thereto, and the display 134 may be detachably coupled to the center fascia 130 of the vehicle 100.

The display 134 may be implemented by any one of a Liquid Crystal Display (LCD), a Light Emitting Diode (LED), a Plasma Display Panel (PDP), an Organic Light Emitting Diode (OLED) or a Cathode Ray Tube (CRT), without being limited thereto.

In addition, the dashboard 150 may include various instrument panels on which a vehicle speed, revolutions per minute (rpm) of an engine and remaining fuel quantity can be displayed, and may further include a glove box in which various goods can be stored.

The speaker 160 configured to output an acoustic or sound signal may be embedded in the vehicle 100.

The speaker 160 may output an acoustic or sound signal indicating the recommended traveling method corresponding to the output signal is being employed, such that passengers of the vehicle can recognize the recommended traveling method by listening to the acoustic or sound signal.

Meanwhile, the vehicle may receive a control command from passengers including a vehicle driver, and may operate according to the received control command. For example, the driver may control the air-conditioner 131, the clock 132, the audio device 133 or the display 134 using buttons mounted to the center fascia 130.

In addition, the vehicle may recognize a voice signal of passengers including a driver, and may operate according to a control command corresponding to the recognized voice signal. The vehicle designed for such voice recognition may further include an automatic gain control module configured to amplify an input voice signal such that the vehicle can easily recognize the voice signal of the driver.

The vehicle including the automatic gain control module according to an embodiment will hereinafter be described with reference to the attached drawings.

Figure 3:
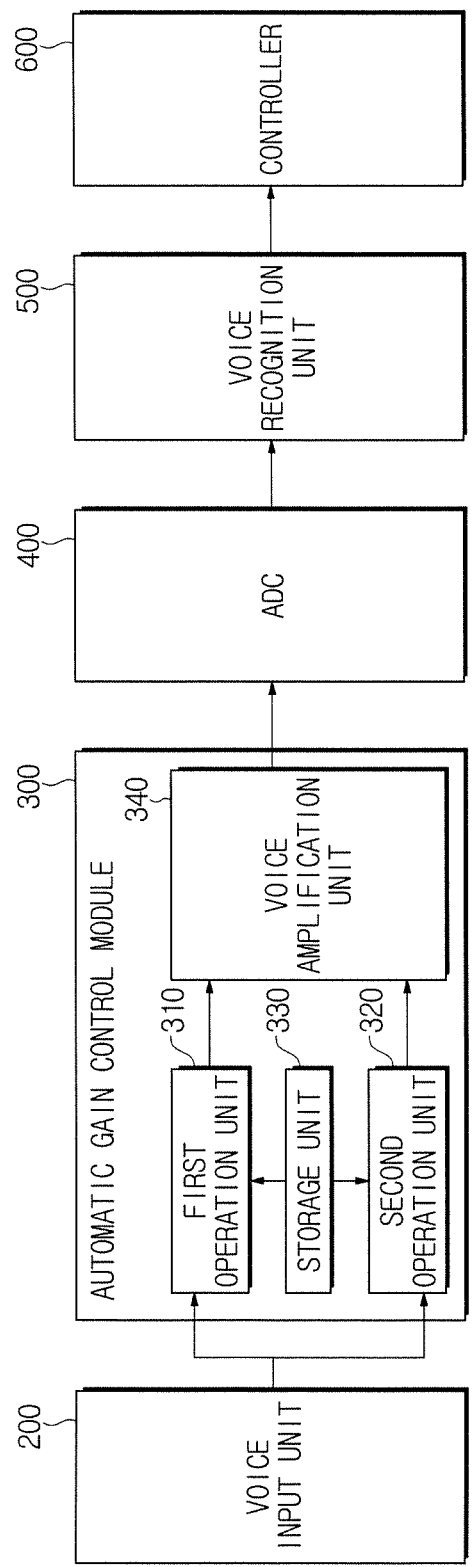
FIG. 3 is a block diagram illustrating a vehicle according to an embodiment of the present disclosure.

FIG. 3 is a block diagram illustrating a vehicle according to an embodiment of the present disclosure. FIG. 4A illustrates a conventional table including gain values corresponding to intensities of a voice signal, and FIG. 4B illustrates an exemplary table including gain values corresponding to intensities of a voice signal according to an embodiment of the present disclosure.

Referring to FIG. 3, the vehicle may include a voice input unit 200 to generate a voice signal upon receiving a command signal from a vehicle driver; an automatic gain control module 300 to amplify the voice signal generated through the voice input unit 200 in such a manner that the amplified voice signal has optimum intensity for voice recognition; an analog-to-digital converter (ADC) 400 to convert the amplified voice signal into a digital voice signal; and a voice recognition unit 500 to perform voice recognition using the digital voice signal.

The voice input unit 200 may be configured to receive a voice signal from passengers including a vehicle driver, and may include a microphone as necessary. The voice input unit 200 may convert the received voice signal into an analog voice signal.

The voice input unit 200 may be located at a specific position at which the voice input unit 200 can easily receive a voice signal of passengers including the driver. For example, the voice input unit 200 may be located above the driver seat.

The automatic gain control module 300 may amplify the voice signal to a predetermined signal intensity optimal for voice recognition. For this purpose, the automatic gain control module 300 may include a first operation unit 310 to determine a first gain value used for amplification of a voice signal in a manner that energy of the voice signal reaches a target energy; a second operation unit 320 to determine a second gain value used for amplification of the voice signal in a manner that a peak value of the voice signal reaches a maximum value capable of being amplified; a storage unit 330 to store at least one of a first table indicating gain values corresponding to energy of the voice signal and a second table indicating gain values corresponding to the peak value of the voice signal; and a voice amplification unit 340 to amplify the voice signal according to a minimum value from among the first gain value and the second gain value.

The first operation unit 310 may determine a first gain value used to amplify the voice signal on the basis of the energy of the voice signal. In more detail, the first operation unit 310 may determine a first gain value used to amplify the voice signal in a manner that the energy of the voice signal reaches a predetermined target energy. In this case, the target energy may indicate voice signal energy sufficient to perform voice recognition.

Alternatively, the first operation unit 310 may acquire voice signal intensity on the basis of the voice signal energy, and may determine a first gain value using the acquired voice signal intensity. In this case, the first operation unit 310 may acquire a predetermined voice signal intensity ($I_1$) using the following equation 1.

$$I_1[dB] = 20\log\frac{E_1}{E_0} \quad \text{[Equation 1]}$$

In Equation 1, $E_1$ may denote energy of an input voice signal, and $E_0$ ($E_0=1\times10^{-12}$ W/m$^2$) may denote an audible threshold value indicating minimum sound energy audible to the human ear.

Upon acquisition of the voice signal intensity, the first operation unit 310 may determine a first gain value to amplify a voice signal in a manner that voice signal intensity reaches target intensity decided on the basis of target energy. In this case, the target intensity may be preset to a predetermined intensity optimal for voice recognition. For example, the target intensity may be preset to −18 dB.

The first operation unit 310 may determine a first gain value with reference to the first table stored in the storage unit 330. In this case, the first table may represent the relationship among intensity of a voice signal, an intensity level and a gain value.

FIG. 4A shows an example of a first table according to the conventional art. The first table according to the conventional art may represent the relationship between intensity of a previous voice signal, intensity level of the previous voice signal and a gain value. In other words, a method for amplifying a voice signal according to the conventional art may determine a first gain value used for amplification of a current input voice signal on the basis of intensity of the previous voice signal. For example, if the previous voice signal has intensity of −40 dB, a first gain value used for amplification of a current input voice signal may be set to intensity of +6 dB.

As a result, there is a high probability that the conventional voice signal amplification method will fail to amplify the initial input voice signal to optimal intensity. As a result, the initial input voice signal may be unrecognized or misrecognized such that the same voice signal must be re-input.

In addition, according to the conventional voice signal amplification method, a passenger who speaks softly may be forced to re-input the same voice signal several times. Table 1 exemplarily shows a process for determining a first gain value under the condition that a target intensity level is set to 4 Lv and a speaking user from among passengers speaks a voice signal having intensity of −40 dB.

TABLE 1

| Number of times | Previous voice intensity | Gain value | Amplified voice intensity |
|---|---|---|---|
| 1 | −40 dB | +6 dB | −34 dB |
| 2 | −34 dB | +3 dB | −31 dB |
| 3 | −31 dB | +3 dB | −27 dB |
| 4 | −27 dB | 0 dB | −27 dB |

As can be seen from Table 1, a gain value acquired by one input of a voice signal is +6 dB, so that the amplified signal intensity reaches −34 dB. Since the amplified signal intensity is set to −34 dB, the speaker from among passengers may be forced to speak again. Therefore, when the voice signal is input twice, a gain value is set to +3 dB, such that the amplified signal intensity reaches −31 dB. As described above, the speaker needs to speak his or her voice signal several times (e.g., four times). Under the condition that the speaker must speak the same voice signal four times, the voice signal is amplified and the amplified signal intensity reaches a target intensity level, resulting in implementation of voice recognition.

As described above, the conventional voice signal amplification method may request the speaker user to repeatedly speak a voice signal, such that it can determine a gain value for the beginning of a target signal level. As a result, since a time consumed for voice recognition increases, the speaker may abandon speaking again before the input voice signal reaches a target signal level.

In order to address the above-mentioned issues, the first operation unit 310 of the automatic gain control module 300 may use the first table indicating the relationship among intensity of a current input voice signal, intensity level of the current input voice signal and a gain value.

The first table shown in FIG. 4B may indicate the relationship among intensity of a current input voice signal, intensity level of the current input voice signal and a gain value. By means of the first table shown in FIG. 4B, the first operation unit 310 may determine a first gain value for amplification of the current input voice signal on the basis of intensity of the current input voice signal.

For example, assuming that a target intensity level is set to 4 Lv and the current input voice signal intensity is set to −40 dB, a gain value is denoted by +22 dB so that the amplified voice signal has intensity of −18 dB. As a result, the amplified voice signal enters the target intensity level, such that it can be immediately used for voice recognition.

As described above, the automatic gain control module 300 may determine in real time a gain value corresponding to the current input voice signal, and may amplify the voice signal using the determined gain value, such that an accuracy of voice recognition can be increased and a time consumed for such voice recognition can be reduced.

The above-mentioned description has disclosed that the first operation unit 310 determines the first gain value on the basis of the predetermined first table. Alternatively, the first operation unit 310 may directly calculate a first gain value for amplification of the voice signal in a manner that the energy of the voice signal can reach a target energy. Further, the first operation unit 310 may directly calculate the first gain value for amplification of the voice signal in a manner that intensity of the voice signal can reach target intensity determined on the basis of the target energy.

Referring back to FIG. 3, a second operation unit may determine a second gain value for amplification of the voice signal in a manner that a peak value of the voice signal reaches a maximum value capable of being amplified. The operations of the second operation unit 320 will hereinafter be described with reference to FIG. 5.

Figure 5A:
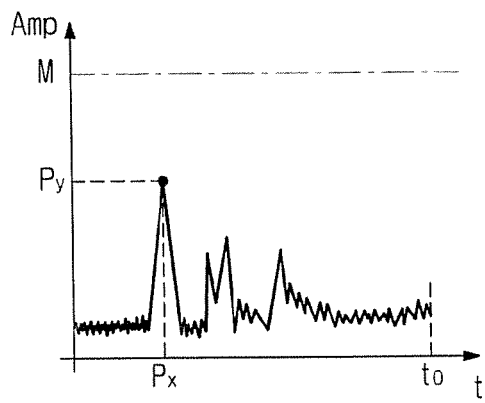
FIGS. 5a-5c are conceptual diagrams illustrating operations of a second operation unit of an automatic gain control module according to embodiments of the present disclosure.
Figure 5B:
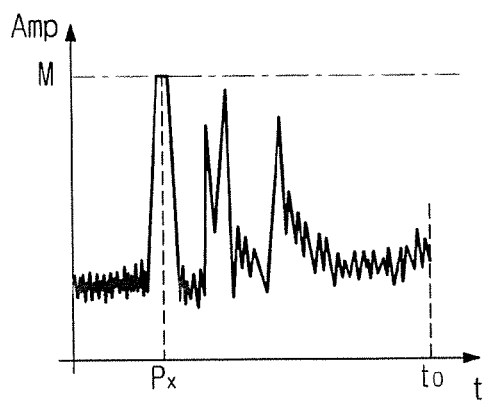
Figure 5C:
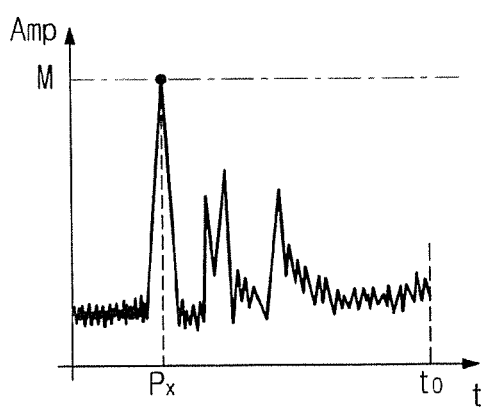

FIGS. 5a-5c are conceptual diagrams illustrating operations of a second operation unit of an automatic gain control module according to an embodiment of the present disclosure. FIG. 5(a) is a graph illustrating an input voice signal on a time axis. FIG. 5(b) is a graph illustrating that the voice signal of FIG. 5(a) is amplified such that clipping occurs on a time axis. FIG. 5(c) is a graph illustrating that the voice signal of FIG. 5(a) is amplified according to a second gain value and the amplified result is marked on a time axis. In FIGS. 5(a), 5(b) and 5(c), M may denote a maximum value capable of being amplified.

If the maximum value capable of being amplified is determined according to performance of the voice amplification unit 340 to be described, a value higher than the above maximum value may be output as a maximum amplifiable value. Referring to FIG. 5(a), a current input voice signal may have a peak value ($P_y$) at a specific time ($P_x$). If the graph (a) is amplified as in the graph (b), the amplified voice signal may have a maximum amplifiable value (M) in the vicinity of the specific time ($P_x$). That is, a peak value of the amplified voice signal is higher than the maximum amplifiable value (M), such that clipping may occur. The occurrence of clipping may indicate loss of a voice signal, such that accuracy of voice recognition may be reduced.

Therefore, when the voice signal is amplified, it may be necessary to consider a maximum amplifiable value. In more detail, the second operation unit 320 may determine a second gain value for amplification of a voice signal in a manner that a peak value of the voice signal can reach a maximum amplifiable value.

Referring to FIG. 5(c), the amplified voice signal may have a peak value (M) at a specific time ($P_x$). As described above, assuming that the voice signal is amplified in consideration of the maximum amplifiable value, it may be possible to acquire a lossless amplified voice signal.

The second operation unit 320 may directly calculate a second gain value by which a peak value of the voice signal can be identical to a maximum amplifiable value.

Alternatively, a second table indicating the relationship among a peak value of the voice signal, a peak level of the voice signal, and a gain value may be pre-stored in the storage unit 330. The second operation unit 320 may acquire a second gain value corresponding to a peak value of the voice signal on the basis of the second table.

If the first gain value and the second gain value are determined, the voice amplification unit 340 may amplify the input voice signal according to a minimum value from among the first gain value and the second gain value. Assuming that the first gain value is higher than the second gain value and the voice signal is amplified according to the first gain value, unexpected clipping may occur in the amplified voice signal. Therefore, the voice amplification unit 340 may amplify the voice signal according to the first gain value only when the first gain value is less than the second gain value.

In contrast, assuming that the first gain value is higher than the second gain value, the voice amplification unit 340 amplifies the voice signal according to the second gain value, such that it can prevent the voice signal from being lost or damaged.

In addition, the voice amplification unit 340 may not amplify the voice signal when energy of the voice signal acquired from the first operation unit 310 is equal to or higher than a specific energy (hereinafter referred to as an amplification unnecessary energy) at which amplification is unnecessary. In this case, this amplification unnecessary energy may indicate the lowest energy of a voice signal capable of being used for voice recognition, and may be determined during a device manufacturing process or by a user input signal as necessary.

The above-mentioned situation in which the voice signal energy is equal to or higher than the amplification unnecessary energy may denote that a current voice signal can be used for voice recognition without any amplification. As a result, the automatic gain control module 300 may quickly output a voice signal for voice recognition without passing through unnecessary calculation.

Referring to FIG. 3, the ADC 400 may convert the voice signal generated from the automatic gain control module 300 into a digital signal. The voice recognition unit 500 to be described may receive the digital signal and recognize the voice signal using the received digital signal, such that it can convert an analog voice signal into a digital voice signal.

After the voice signal has been converted into the digital voice signal, the voice recognition unit 500 may apply a speech recognition algorithm (SRA) or a speech recognition engine (SRE) to the digital voice signal such that the voice recognition unit 500 may recognize a voice signal of passengers including a vehicle driver using the application result.

In this case, the voice signal may be converted into another signal being more useful to voice recognition. The voice recognition unit 500 may detect the start point and the end point of the voice signal, such that it can detect an actual voice section contained in the voice signal. The above-mentioned scheme of the voice recognition unit 500 is referred to as the end point detection (EPD) scheme.

Feature vector extraction technology (for example, cepstrum, Linear Predictive Coefficient (LPC), Mel Frequency Cepstral Coefficient (MFCC), a Filter Bank Energy, or the like) may be applied to the detected section, such that a feature vector of voice data (VD) can be extracted.

The extracted feature vector is compared with a trained reference pattern, such that the recognition result can be acquired. For this purpose, the acoustic model in which signal characteristics of a voice signal are modeled and compared may be used, and the language model showing the linguistic order relationship among words or syllables of recognized vocabulary may be used.

The voice recognition unit 500 may be implemented in a computer-readable recording medium using software, hardware or a combination thereof.

According to hardware implementation, exemplary embodiments described herein may be realized using at least one of Application Specific Integrated Circuits (ASICs), digital signal processors (DSPs), digital signal processing devices (DSPDs), programmable logic devices (PLDs), field programmable gate arrays (FPGAs), processors, micro-controllers, microprocessors, and an electric unit for performing other functions.

If operations or functions of the present disclosure are implemented by software, the voice recognition unit 500 can be implemented by separate software modules. Software code may be implemented by a software application written in an appropriate program language.

If the voice recognition unit 500 acquires the voice recognition result, the controller 600 may generate a control command based on the voice recognition result. Finally, the controller 600 may transmit the control command to the corresponding element, such that it can control the operation of the corresponding element.

FIG. 6 is a flowchart illustrating a vehicle control method according to an embodiment of the present disclosure.

Referring to FIG. 6, a vehicle determines whether a voice signal is input through a voice input unit in operation 700. If the voice signal is not input through the voice input unit, the vehicle may determine whether the voice signal is input.

If the voice signal is input, the voice input unit may generate a voice signal on the basis of the input voice signal in operation 710. The generated voice signal acting as an electric signal may be used to perform voice recognition in a subsequent procedure.

If the voice signal is generated, the first operation unit of the automatic gain control module may acquire energy ($E_1$) of the voice signal in operation 720. Voice signal energy is proportional to accuracy of voice recognition. The first operation unit 310 may acquire energy ($E_1$) of the voice signal, prior to deciding the first gain value.

The first operation unit may calculate a first gain value ($G_1$) for allowing the voice signal energy ($E_1$) to reach the target energy ($E_G$) in operation 730. In this case, the target energy ($E_G$) may represent voice signal energy sufficient to perform voice recognition.

Simultaneously, the second operation unit may acquire a peak value ($P_y$) of the voice signal in operation 740. Thereafter, the second operation unit may calculate a second gain value ($G_2$) for allowing the peak value ($P_y$) of the voice signal to reach a maximum amplification value (M) in operation 750. In this case, the maximum amplification value (M) may represent a maximum value capable of being amplified by the voice amplification unit 340 of the automatic gain control module 300.

After acquisition of the first gain value ($G_1$) and the second gain value ($G_2$), the voice amplification unit may determine whether the first gain value ($G_1$) is equal to or higher than the second gain value ($G_2$) in operation 760. Assuming that the first gain value ($G_1$) is equal to or higher than the second gain value ($G_2$), if the voice signal is amplified according to the first gain value ($G_1$), clipping may occur, resulting in loss of voice information.

Therefore, if the first gain value ($G_1$) is equal to or higher than the second gain value ($G_2$), the voice amplification unit may amplify the voice signal according to the second gain value ($G_2$) in operation 770.

Alternatively, if the first gain value ($G_1$) is less than the second gain value ($G_2$), the voice amplification unit may amplify the voice signal according to the first gain value ($G_1$) in operation 780. In this case, no clipping may occur in the voice signal amplified by the first gain value ($G_1$).

Finally, the voice amplification unit may perform voice recognition using the amplified voice signal in operation 790.

FIG. 7 is a flowchart illustrating a vehicle control method according to another embodiment of the present disclosure.

Referring to FIG. 7, the vehicle may determine whether a voice signal is input through a voice input unit in operation 800. If the voice signal is not input through the voice input unit in operation 800, the vehicle may repeatedly determine whether the voice signal is input.

If the voice signal is input, the voice input unit may generate a voice signal on the basis of the input voice signal in operation 810. The generated voice signal acting as an electric signal may be used to perform voice recognition in a subsequent procedure.

If the voice signal is generated, the first operation unit of the automatic gain control module may acquire energy ($E_1$) of the voice signal in operation 820. Voice signal energy is proportional to accuracy of voice recognition. The first operation unit 310 may acquire energy ($E_1$) of the voice signal, prior to deciding the first gain value.

The first operation unit may calculate intensity ($I_1$) of the voice signal on the basis of the voice signal energy ($E_1$) in operation 830. In this case, the first operation unit 310 may acquire the voice signal intensity ($I_1$) according to the above-mentioned Equation 1.

After acquisition of the voice signal intensity ($I_1$), the first operation unit may calculate a first gain value ($G_1$) for allowing the voice signal intensity ($I_1$) to reach the target energy ($I_G$) decided on the basis of target energy in operation 840. In this case, the target energy may represent voice signal energy sufficient to perform voice recognition, and the target intensity may be acquired by substituting the target energy into Equation 1.

Simultaneously, the second operation unit of the automatic gain control module may acquire a peak value ($P_y$) of the voice signal in operation 825. Thereafter, the second operation unit may calculate a second gain value ($G_2$) for allowing the peak value ($P_y$) of the voice signal to reach a maximum amplification value (M) in operation 845. In this case, the maximum amplification value (M) may represent a maximum value capable of being amplified by the voice amplification unit 340 of the automatic gain control module 300.

After acquisition of the first gain value ($G_1$) and the second gain value ($G_2$), the voice amplification unit of the automatic gain control module may determine whether the first gain value ($G_1$) is equal to or higher than the second gain value ($G_2$) in operation 850. Assuming that the first gain value ($G_1$) is equal to or higher than the second gain value ($G_2$), if the voice signal is amplified according to the first gain value ($G_1$), clipping may occur, resulting in loss of voice information.

Therefore, if the first gain value ($G_1$) is equal to or higher than the second gain value ($G_2$), the voice amplification unit may amplify the voice signal according to the second gain value ($G_2$) in operation 860.

In contrast, if the first gain value ($G_1$) is less than the second gain value ($G_2$), the voice amplification unit may amplify the voice signal according to the first gain value ($G_1$) in operation 865. In this case, no clipping may occur in the voice signal amplified by the first gain value ($G_1$).

Finally, the voice amplification unit may perform voice recognition using the amplified voice signal in operation 870.

FIG. 8 is a flowchart illustrating a vehicle control method according to another embodiment of the present disclosure.

Referring to FIG. 8, the vehicle may determine whether a voice signal is input through a voice input unit in operation 900. If the voice signal is not input through the voice input unit in operation 900, the vehicle may repeatedly determine whether the voice signal is input.

If the voice signal is input, the voice input unit may generate a voice signal on the basis of the input voice signal in operation 910. The generated voice signal acting as an electric signal may be used to perform voice recognition in a subsequent procedure.

If the voice signal is generated, the first operation unit of the automatic gain control module may acquire energy ($E_1$) of the voice signal in operation 920. Voice signal energy is proportional to accuracy of voice recognition. The first operation unit 310 may acquire energy ($E_1$) of the voice signal, prior to deciding the first gain value.

The first operation unit may calculate intensity ($I_1$) of the voice signal on the basis of the voice signal energy ($E_1$) in operation 930. In this case, the first operation unit 310 may acquire the voice signal intensity ($I_1$) according to the above-mentioned Equation 1.

After acquisition of the voice signal intensity ($I_1$), the first operation unit may confirm an intensity level ($K_1Lv$) to which the voice signal intensity ($I_1$) belongs in operation 940. In this case, the intensity level may indicate that the voice signal intensity is divided into a plurality of sections such that the plural sections are sequentially arranged.

If the voice signal intensity level is confirmed, the first operation unit may confirm the first gain value ($G_1$) corresponding to the intensity level ($K_1Lv$) in a predetermined first table in operation 950. In this case, the first table may represent the relationship between intensity levels and gain values.

Simultaneously, the second operation unit may acquire a peak value ($P_y$) of the voice signal in operation 925. Thereafter, the second operation unit may confirm the peak level ($K_2Lv$) to which the peak value ($P_y$) of the voice signal belongs in operation 945. In this case, the peak level may represent that the voice signal peak value is divided into a plurality of sections such that the plural sections are sequentially arranged.

If the peak level of the voice signal is confirmed, the second operation unit may calculate a second gain value ($G_2$) corresponding to the peak level ($K_2Lv$) in a predetermined second table in operation 955. In this case, the second table may represent the relationship between peal levels and gain values.

After acquisition of the first gain value ($G_1$) and the second gain value ($G_2$), the voice amplification unit of the automatic gain control module may determine whether the first gain value ($G_1$) is equal to or higher than the second gain value ($G_2$) in operation 960. Assuming that the first gain value ($G_1$) is equal to or higher than the second gain value ($G_2$), if the voice signal is amplified according to the first gain value ($G_1$), clipping may occur, resulting in loss of voice information.

Therefore, if the first gain value ($G_1$) is equal to or higher than the second gain value ($G_2$), the voice amplification unit may amplify the voice signal according to the second gain value ($G_2$) in operation 970.

Alternatively, if the first gain value ($G_1$) is less than the second gain value ($G_2$), the voice amplification unit may amplify the voice signal according to the first gain value ($G_1$) in operation 975. In this case, no clipping may occur in the voice signal amplified by the first gain value ($G_1$).

Finally, the voice amplification unit may perform voice recognition using the amplified voice signal in operation 980.

Figure 9:
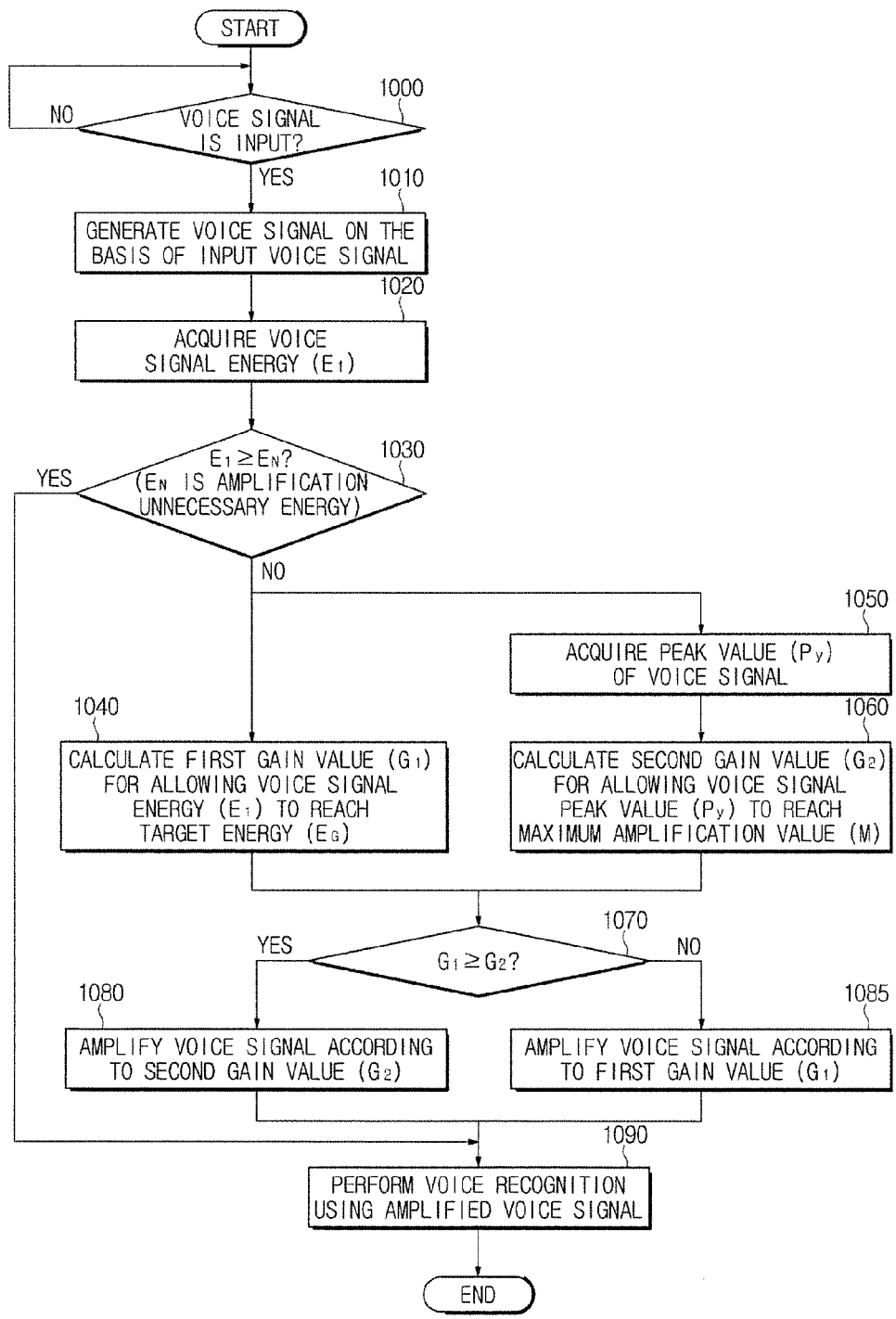
FIG. 9 is a flowchart illustrating a vehicle control method according to another embodiment of the present disclosure.

FIG. 9 is a flowchart illustrating a vehicle control method according to another embodiment of the present disclosure.

Referring to FIG. 9, the vehicle may determine whether a voice signal is input through a voice input unit in operation 1000. If the voice signal is not input through the voice input unit in operation 1000, the vehicle may repeatedly determine whether the voice signal is input.

If the voice signal is input, the voice input unit may generate a voice signal on the basis of the input voice signal in operation 1010. The generated voice signal acting as an electric signal may be used to perform voice recognition in a subsequent procedure.

If the voice signal is generated, the first operation unit of the automatic gain control module may acquire energy ($E_1$) of the voice signal in operation 1020. Voice signal energy is proportional to accuracy of voice recognition. The first operation unit 310 may acquire energy ($E_1$) of the voice signal, prior to deciding the first gain value.

Thereafter, the first operation unit may determine whether the voice signal energy ($E_1$) is equal to or higher than predetermined amplification unnecessary energy ($E_N$) in operation 1030. In this case, this amplification unnecessary energy may indicate the lowest energy of a voice signal capable of being used for voice recognition, and may be predetermined by a device manufacturing process or by a user input signal as necessary.

If the voice signal energy ($E_1$) is equal to or higher than the amplification unnecessary energy ($E_N$), the voice amplification unit 340 may not amplify the voice signal and then apply the voice signal to the voice recognition unit 500.

In contrast, if the voice signal energy ($E_1$) is less than predetermined amplification unnecessary energy ($E_N$), the first operation unit may calculate a first gain value ($G_1$) for allowing the voice signal energy ($E_1$) to reach the target energy ($E_G$) in operation 1040. In this case, the target energy may indicate voice signal energy sufficient to perform voice recognition.

Simultaneously, the second operation unit of the automatic gain control module may acquire a peak value ($P_y$) of the voice signal in operation 1050. Thereafter, the second operation unit may calculate a second gain value ($G_2$) for allowing the peak value ($P_y$) of the voice signal to reach a maximum amplification value (M) in operation 1060. In this case, the maximum amplification value (M) may represent a maximum value capable of being amplified by the voice amplification unit 340 of the automatic gain control module 300.

After acquisition of the first gain value ($G_1$) and the second gain value ($G_2$), the voice amplification unit of the automatic gain control module may determine whether the first gain value ($G_1$) is equal to or higher than the second gain value ($G_2$) in operation 1070. Assuming that the first gain value ($G_1$) is equal to or higher than the second gain value ($G_2$), if the voice signal is amplified according to the first gain value ($G_1$), clipping may occur, resulting in loss of voice information.

Therefore, if the first gain value ($G_1$) is equal to or higher than the second gain value ($G_2$), the voice amplification unit may amplify the voice signal according to the second gain value ($G_2$) in operation 1080.

Alternatively, if the first gain value ($G_1$) is less than the second gain value ($G_2$), the voice amplification unit may amplify the voice signal according to the second gain value ($G_2$) in operation 1080. In this case, no clipping may occur in the voice signal amplified by the first gain value ($G_1$).

Finally, the voice amplification unit may perform voice recognition using the voice signal in operation 1090.

As is apparent from the above description, the automatic gain control module, the method for controlling the same, the vehicle including the automatic gain control module, and the method for controlling the vehicle according to exemplary embodiments of the present disclosure can determine in real time a gain value so as to amplify an input voice signal, such that the number of erroneous recognition times of a voice signal is reduced and thus the number of re-recognition times of the voice signal is also reduced.

In addition, the embodiments can consider a peak value when amplifying a voice signal, such that the amount of lost information caused by such voice amplification can be minimized.

Although multiple embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. An automatic gain control module comprising:
    a first operation unit for determining a first gain value used for amplification of a voice signal in a manner that an energy of the voice signal received from an external part reaches a target energy;
    a second operation unit for determining a second gain value used for amplification of the voice signal in a manner that a peak value of the voice signal reaches a maximum value capable of being amplified; and
    a voice amplification unit for amplifying the voice signal according to a minimum value from among the first gain value and the second gain value.

2. The automatic gain control module according to claim 1, wherein the first operation unit acquires an intensity of the voice signal on the basis of the voice signal energy, and determines the first gain value used for amplification of the voice signal in a manner that the voice signal intensity reaches target intensity determined on the basis of the target energy.

3. The automatic gain control module according to claim 1, further comprising:
    a storage unit in which a table including at least one of a gain value corresponding to an intensity level and a gain value corresponding to a peak level is stored.

4. The automatic gain control module according to claim 3, wherein the first operation unit confirms an intensity level of the voice signal on the basis of the voice signal energy, confirms a gain value corresponding to the confirmed intensity level from the storage unit, and determines the confirmed gain value to be the first gain value.

5. The automatic gain control module according to claim 3, wherein the second operation unit confirms a peak level of the voice signal on the basis of the voice signal peak value, confirms a gain value corresponding to the confirmed peak level from the storage unit, and determines the confirmed gain value to be the second gain value.

6. The automatic gain control module according to claim 1, wherein the voice amplification unit does not amplify the voice signal when the voice signal energy is equal to or higher than a specific energy at which amplification is unnecessary.

7. A vehicle comprising:
    a voice input unit for generating a voice signal upon receiving a user voice;
    an automatic gain control module for amplifying the voice signal according to a minimum value from among a first gain value and a second gain value, wherein the first gain value is used to amplify the voice signal in a manner that an energy of the generated voice signal reaches a target energy, and a second gain value is used to amplify the voice signal in a manner that a peak value of the voice signal reaches a maximum value capable of being amplified; and
    a voice recognition unit for performing voice recognition using the amplified voice signal.

8. The vehicle according to claim 7, wherein the automatic gain control module includes:
    a first operation unit for determining a first gain value used for amplification of the voice signal in a manner that the voice signal energy reaches the target energy;
    a second operation unit for determining a second gain value used for amplification of the voice signal in a manner that the voice signal peak value reaches the maximum value capable of being amplified; and
    a voice amplification unit for amplifying the voice signal according to a minimum value from among the first gain value and the second gain value.

9. The vehicle according to claim 8, wherein the first operation unit acquires an intensity of the voice signal on the basis of the voice signal energy, and determines the first gain value used for amplification of the voice signal in a manner that the voice signal intensity reaches a target intensity determined on the basis of the target energy.

10. The vehicle according to claim 8, wherein the automatic gain control module further includes:
    a storage unit in which at least one of a gain value corresponding to intensity level and a gain value corresponding to a peak level is stored.

11. The vehicle according to claim 10, wherein the first operation unit confirms an intensity level of the voice signal on the basis of the voice signal energy, confirms a gain value corresponding to the confirmed intensity level from the storage unit, and determines the confirmed gain value to be the first gain value.

12. The vehicle according to claim 10, wherein the second operation unit confirms a peak level of the voice signal on the basis of the voice signal peak value, confirms a gain value corresponding to the confirmed peak level from the storage unit, and determines the confirmed gain value to be the second gain value.

13. The vehicle according to claim 7, wherein the automatic gain control module does not amplify the voice signal when the voice signal energy is equal to or higher than specific energy at which amplification is unnecessary.

14. A method for controlling a vehicle, comprising:
    generating a voice signal upon receiving a user voice;
    amplifying the voice signal according to a minimum value from among a first gain value and a second gain value, wherein the first gain value is used to amplify the voice signal in a manner that an energy of the generated voice signal reaches a target energy, and a second gain value is used to amplify the voice signal in a manner that a peak value of the voice signal reaches a maximum value capable of being amplified; and performing voice recognition using the amplified voice signal.

15. The method according to claim 14, wherein amplifying the voice signal includes:

determining a first gain value used for amplification of the voice signal in a manner that the voice signal energy reaches the target energy;

determining a second gain value used for amplification of the voice signal in a manner that the voice signal peak value reaches the maximum value capable of being amplified; and amplifying the voice signal according to a minimum value from among the first gain value and the second gain value.

16. The method according to claim 15, wherein determining the first gain value includes:

acquiring an intensity of the voice signal on the basis of the voice signal energy; and determining the first gain value used for amplification of the voice signal in a manner that the voice signal intensity reaches target intensity determined on the basis of the target energy.

17. The method according to claim 15, further comprising:

pre-storing a table including at least one of a gain value corresponding to an intensity level and a gain value corresponding to a peak level.

18. The method according to claim 17, wherein determining the first gain value includes:

confirming an intensity level of the voice signal on the basis of the voice signal energy;

confirming a gain value corresponding to the confirmed intensity level from the table; and determining the confirmed gain value to be the first gain value.

19. The method according to claim 17, wherein determining the second gain value includes:

confirming a peak level of the voice signal on the basis of the voice signal peak value;

confirming a gain value corresponding to the confirmed peak level from the table; and determining the confirmed gain value to be the second gain value.

20. The method according to claim 15, wherein amplifying the voice signal further includes:

not-amplifying the voice signal when the voice signal energy is equal to or higher than specific energy at which amplification is unnecessary.

* * * * *